US008614639B1

(12) United States Patent
Yin et al.

(10) Patent No.: US 8,614,639 B1

(45) Date of Patent: Dec. 24, 2013

(54) INTEGRATOR RAMP GENERATOR WITH DAC AND SWITCHED CAPACITORS

(75) Inventors: Ping Hung Yin, Irvine, CA (US); Satya Narayan Mishra, Irvine, CA (US); Amit Mittra, Irvine, CA (US)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 13/593,520

(22) Filed: Aug. 24, 2012

(51) Int. Cl.
*H03M 1/56* (2006.01)

(52) U.S. Cl.
USPC ............................ 341/169; 341/155; 341/144

(58) Field of Classification Search
USPC .......................... 341/144, 122, 155, 169, 170
See application file for complete search history.

(56) References Cited

U.S. PATENT DOCUMENTS

| | | | | |
|---|---|---|---|---|
| 4,686,688 A * | 8/1987 | Chung et al. | ................... | 375/274 |
| 5,818,377 A * | 10/1998 | Wieser | .......................... | 341/144 |
| 6,041,336 A * | 3/2000 | Steinlechner | ..................... | 708/4 |
| 2008/0291072 A1 | 11/2008 | Sano | | |

OTHER PUBLICATIONS

Tony R. Kuphaldt, “Lessons in Electric Circuits”, Nov. 27, 2007, vol. 4, Chapter 13.8 (http://openbookproject.net/electricCircuits/Digital/DIGI_13.html#xtocid74757).

Antonio Oblea, “Design and Operation of Integrating ADCs”, ECE614-Advanced Analog IC Design, May 7, 2008, Boise State University.

Eric Delagnes et al., “A Low Power Multi-Channel Single Ramp ADC With up to 3.2 GHz Virtual Clock”, Nuclear Science, IEEE Transactions, Oct. 2007, pp. 1735-1742, vol. 54.

Jeonghwan Lee et al., “A 10b Column-wise Two-step Single-slope ADC for High-speed CMOS Image Sensor”, 2007 International Image Sensor Workshop, Jun. 7-10, 2007, Session 10, P37, Ogunquit Maine, USA.

http://research.cs.tamu.edu/prism/lectures/iss/iss_18.pdf.

* cited by examiner

*Primary Examiner* — Peguy Jean Pierre

(74) *Attorney, Agent, or Firm* — Su IP Consulting

(57) ABSTRACT

A ramp generator includes a digital-to-analog converter (DAC), a sampling capacitor, an integrator circuit, a polarity reversing switch selectively coupling first and second outputs of the DAC to a first side of the sampling capacitor, a first switch coupling a second side of the sampling capacitor to a reference voltage source, and a second switch coupling the second side of the sampling capacitor to an input of the integrator circuit.

15 Claims, 6 Drawing Sheets

INTEGRATOR RAMP GENERATOR WITH DAC AND SWITCHED CAPACITORS

BACKGROUND

1. Field of the Invention

The present disclosure generally relates to a ramp generator for an analog-to-digital converter (ADC).

2. Description of the Related Art

Unless otherwise indicated herein, the approaches described in this section are not prior art to the claims in this application and are not admitted to be prior art by inclusion in this section.

In a single-slope analog-to-digital converter (ADC), an integrator generates a decrementing or incrementing waveform that is compared against an analog input by a comparator. The time it takes for the waveform to exceed the analog input voltage level is measured by a digital counter. A digital ramp ADC is similar to the single-slope ADC except a digital-to-analog converter (DAC) generates the waveform to the comparator.

SUMMARY

In one or more embodiments of the present disclosure, a ramp generator includes a digital-to-analog converter (DAC), a sampling capacitor, an integrator circuit, a polarity reversing switch selectively coupling first and second outputs of the DAC to a first side of the sampling capacitor, a first switch coupling a second side of the sampling capacitor to a reference voltage source, and a second switch coupling the second side of the sampling capacitor to an input of the integrator circuit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are therefore not to be considered limiting of its scope, the disclosure will be described with additional specificity and detail through use of the accompanying drawings.

In the drawings.

DETAILED DESCRIPTION

Figure 1A:
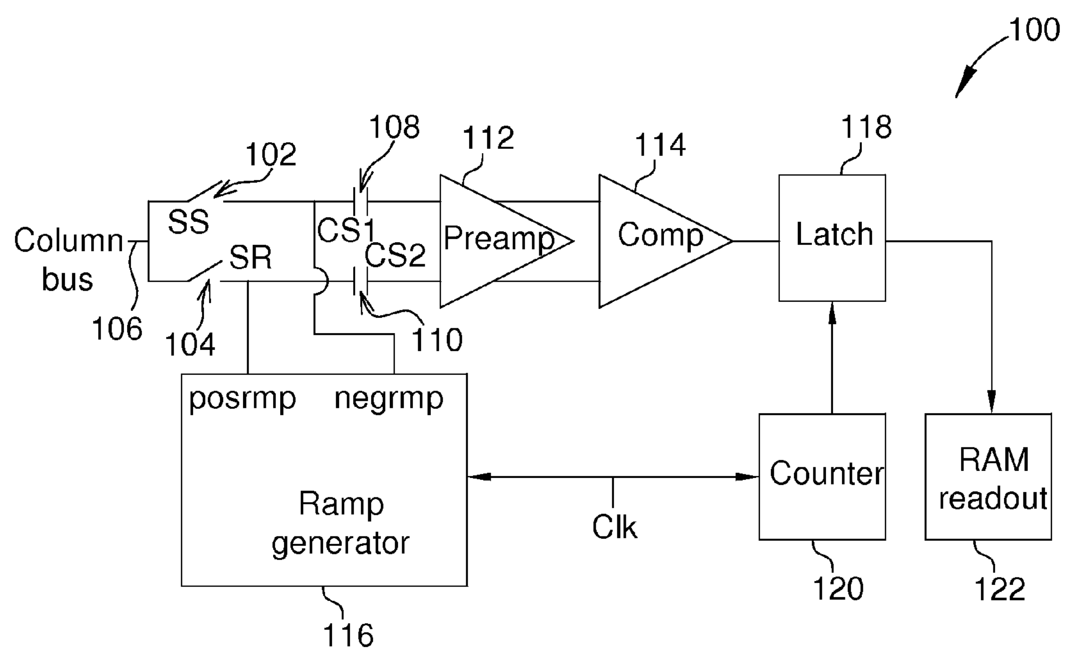
FIG. 1A is a block diagram of a differential single-slope analog-to-digital converter (ADC)
Figure 1B:
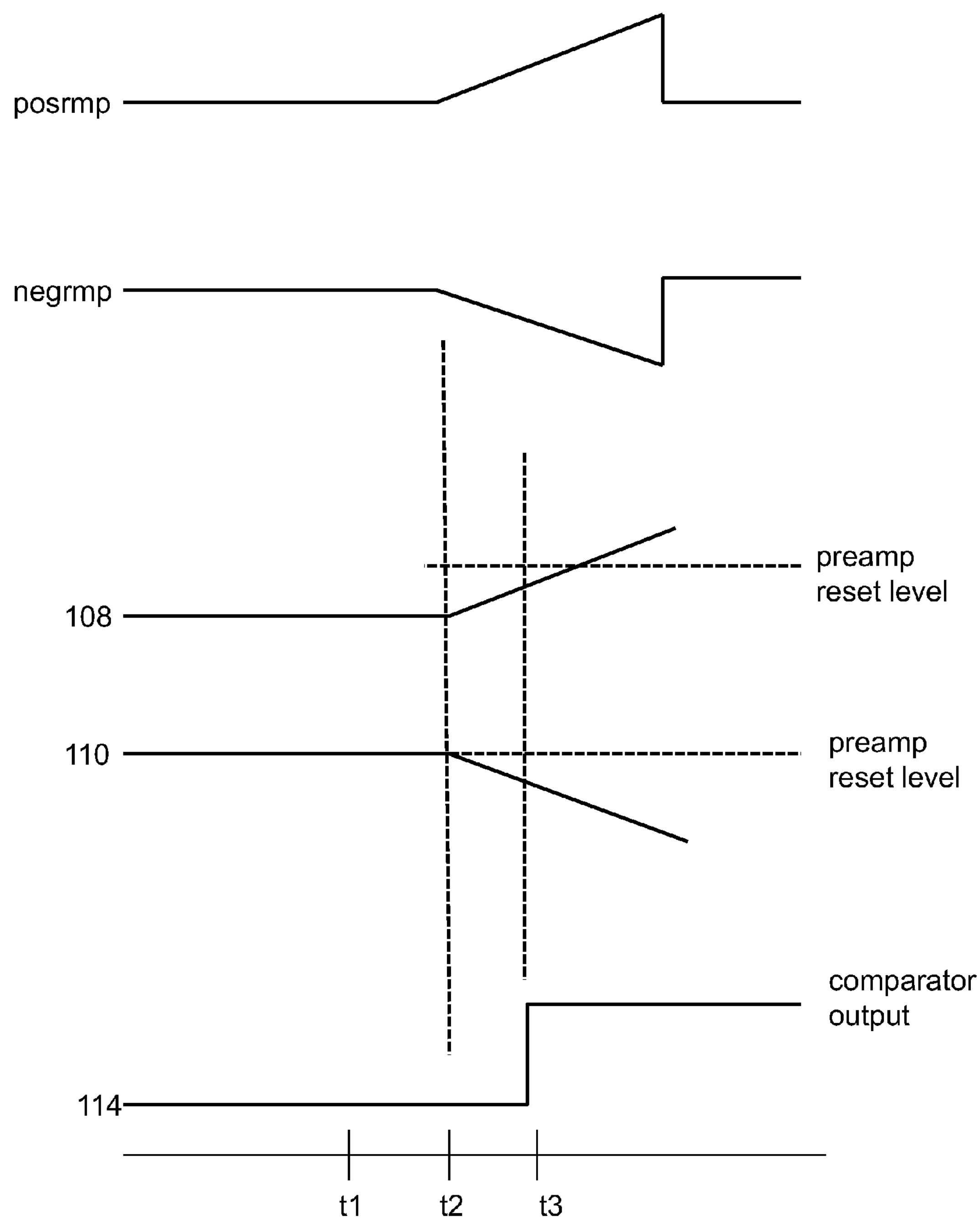
FIG. 1B is a timing diagram of the ADC of FIG. 1A.

FIG. 1A is a block diagram of a differential single-slope analog-to-digital converter (ADC) 100. ADC 100 includes switches 102 and 104 that sample a pixel signal and a reset signal from a column bus line 106 onto the first side of sampling capacitors 108 and 110, respectively. Sampling capacitors 108 and 110 hold the pixel signal and the reset signal. As shown in the timing diagram of FIG. 1B, in one embodiment of present disclosure, pixel and rest signals have been sampled onto capacitors 108 and 110 at time t1.

The second side of sampling capacitors 108 and 110 are coupled to the inputs of a preamplifier 112, whose outputs depend on which input is higher. The outputs of preamplifier 112 are coupled to the inputs of a comparator 114, whose output depends on which input is higher.

Based on the same clock signal, a ramp generator 116 applies a negative ramp signal "negrmp" and a positive ramp signal "posrmp" to the pixel signal and the reset signal on the first side of sampling capacitors 108 and 110, respectively. As shown in the timing diagram of FIG. 1B, negrmp and posrmp signals begin at time t2. When the two signals meet halfway between the pixel signal and the reset signal, preamplifier 112 starts to reverse its outputs. The reversal of the preamplifier outputs triggers comparator 114, which in turn triggers a latch 118 to capture the value of a counter 120 based on the same clock signal as ramp generator 116. Latch 118 outputs the value to a random access memory (RAM) 122. As shown in the timing diagram of FIG. 1B, the two signals meet halfway at a time t3 and cause the output of comparator 114 to trip.

Figure 2:
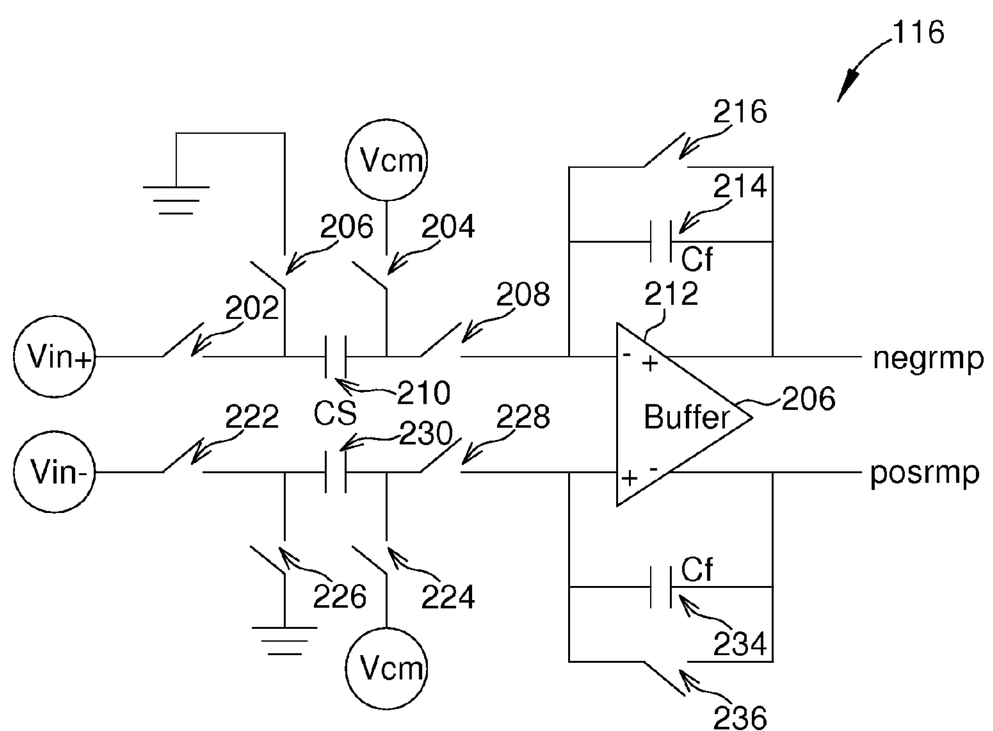
FIG. 2 is a schematic of a ramp generator for the ADC of FIG. 1A.

FIG. 2 is a schematic of a ramp generator 116 for ADC 100 of FIG. 1A. Ramp generator 116 may be a differential switched capacitor integrator having two complementary halves for generating negative and positive ramp signals. The first half for generating the negative ramp signal is first explained.

In the sampling mode, switches 202, 204 are on and switches 206, 208 are off to allow the voltage across a sampling capacitor 210 to track a positive input voltage Vin+ while a buffer 212 and feedback capacitor 214 hold the previous value. In the transition to the integration mode, switch 204 turns off first, injecting a constant charge onto sampling capacitor 210, and then switch 202 turns off. In the integration mode, switches 206 and 208 turn on. The charge stored on sampling capacitor 210 is therefore transferred to feedback capacitor 214. In the transition back to the sampling mode, switch 208 turns off before switch 206 turns off. This process repeats to iteratively decrement the negative ramp signal. At the end of this process, a switch 216 turns on to reset feedback capacitor 214.

The second half operates in a mirror fashion with a negative input voltage Vin− to output the positive ramp signal. In the sampling mode, switches 222, 224 are on and switches 226, 228 are off to allow the voltage across sampling capacitor 230 to track negative input voltage Vin− while buffer 212 and feedback capacitor 214 hold the previous value. In the transition to the integration mode, switch 224 turns off first, injecting a constant charge onto sampling capacitor 230, and then switch 222 turns off. In the integration mode, switches 226 and 228 turn on. The charge stored on sampling capacitor 230 is therefore transferred to feedback capacitor 234. In the transition back to the sampling mode, switch 228 turns off before switch 226 turns off. This process repeats to iteratively increment the positive ramp signal. At the end of this process, a switch 236 turns on to reset feedback capacitor 234.

In one example where ADC 100 converts pixel signals that range from 0 to 1 volt, ramp generator 116 generates ramp signals that increment and decrement by 1 millivolt (mV) about 1,000 times to provide ADC 100 with 10 bits of resolution (i.e., 1,024 values). However, the kTC noise from resetting sampling capacitors 210 and 230 accumulates with each integration. To minimize the kTC reset noise, the capacitance ratio between sampling capacitor 210/230 and feedback capacitors 214/234 is kept less than 1/32. However, such a ratio will require smaller sampling capacitors 210, 230, which leads to matching problems that impact non-linear ramp performance.

Instead of using ramp generator 116, a 10-bit DAC that decrements and increments by 1 mV may be used. The disadvantage of using a 10-bit DAC is the relatively large size of the circuit, which would take away valuable real estate on a die from other components.

Figure 3:
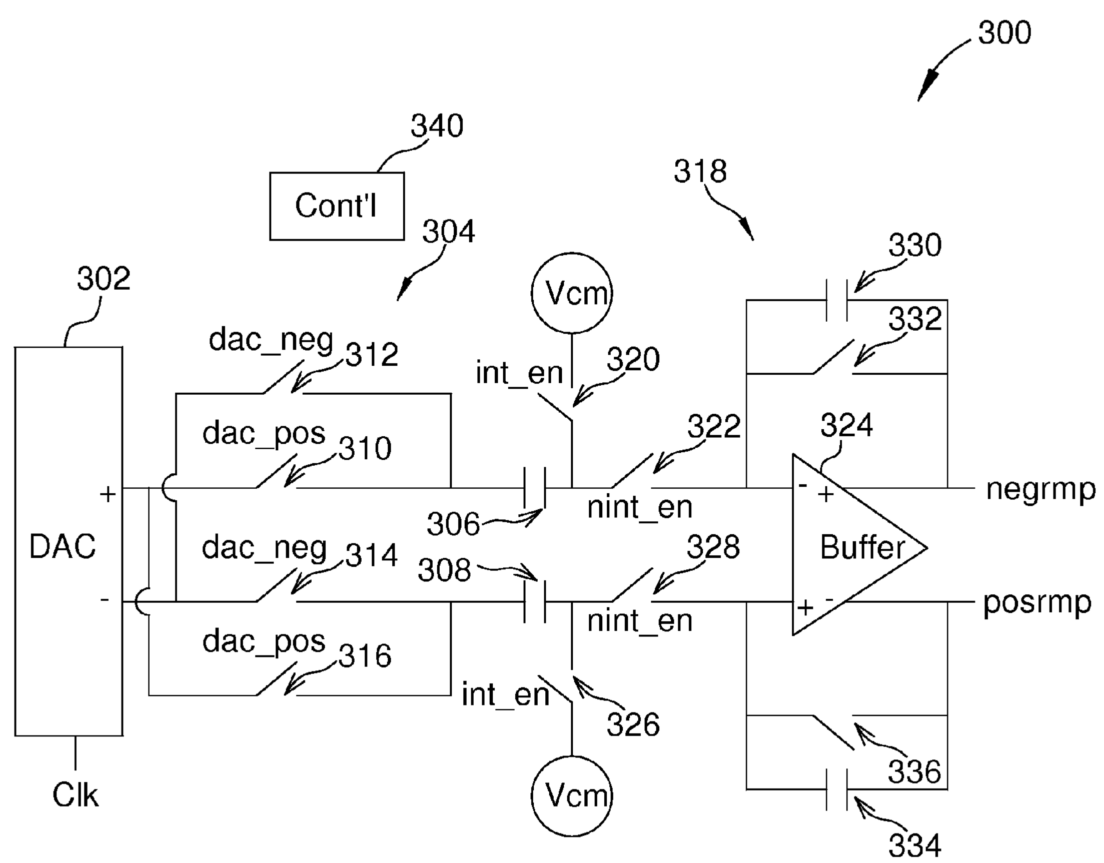
FIG. 3 is a schematic of a ramp generator with a DAC for the ADC of FIG. 1A.

FIG. 3 is a schematic of a ramp generator 300 for an ADC (e.g., ADC 100 of FIG. 1A) in one embodiment of the present disclosure. Ramp generator 300 includes a DAC 302 with a positive output and a negative output. In one example, DAC 302 has 8 bits of resolution. Note that an 8-bit DAC 302 offers significant savings in real estate and power consumption in comparison to a 10-bit DAC. For example, a8-bit DAC 302 may use ¼ the space of a 10-bit DAC. Based on a clock signal, the DAC positive output signal initially increments from its lowest value (corresponding to a digital value of 0) until it reaches its highest value (corresponding to a digital value of 255), and then it decrements until it returns to its lowest value before repeating the process. Based on the same clock signal, the DAC negative output signal initially decrements from its highest value (corresponding to a digital value of 255) until it reaches its lowest value (corresponding to a digital value of 0), and then it increments until it returns to its highest value before repeating the process.

The DAC positive and negative outputs are connected by a polarity reversing switch 304 to sampling capacitors 306 and 308. Polarity reversing switch 304 initially couples the DAC positive output to sampling capacitor 306 and the DAC negative output to sampling capacitor 308. Polarity reversing switch 304 later reverses to couple the DAC negative output to sampling capacitor 306 and the DAC positive output to sampling capacitor 308.

In one example, polarity reversing switch 304 includes a switch 310 that couples the DAC positive output to the first side of sampling capacitor 306 and a switch 312 that couples the DAC negative output to the first side of sampling capacitor 306. Polarity reversing switch 304 further includes a switch 314 that couples the DAC negative output to the first side of sampling capacitor 308 and a switch 316 that couples the DAC positive output to the first side of sampling capacitor 308. Switches 310 and 316 have opposite polarity and are controlled by the same control signal "dac_pos" (e.g., a low value turns on switch 310 but turns off switch 316 and vice versa). Switches 312 and 314 have opposite polarity and are controlled by the same control signal "dac_neg" (e.g., a high value turns on switch 312 but turns off switch 314 and vice versa).

The second sides of sampling capacitors 306 and 308 are coupled to an integrator circuit 318. Integrator circuit 318 adds the input voltages from the sampling capacitors 306 and 308 to the previous voltages to decrement and increment the negative ramp signal and the positive ramp signal, respectively.

In one example, integrator circuit 318 includes a switch 320 that couples the second side of sampling capacitor 306 to a reference voltage (e.g., a common mode voltage "Vcm"), a switch 322 that couples the second side of sampling capacitor 306 to a negative input of a buffer 324, a switch 326 that couples the second side of sampling capacitor 308 to the reference voltage, and a switch 328 that couples the second side of sampling capacitor 308 to the positive input of buffer 324. Switches 320 and 326 are controlled by the same control signal "int_en" (e.g., a high value turns on switches 320 and 326 and vice versa). Switches 322 and 328 are controlled by the same control signal "nint_en" (e.g., a high value turns on switches 322 and 328 and vice versa).

In one example, buffer 324 is a fully differential operational amplifier. Buffer 324 has a positive output that generates the negative ramp signal, which is coupled by a feedback capacitor 330 back to its negative input. A switch 332 is coupled between the two sides of feedback capacitor 330 to reset the capacitor. Buffer 324 has a negative output that generates the positive ramp signal, which is coupled by a feedback capacitor 334 back to its positive input. A switch 336 is coupled between the two sides of feedback capacitor 334 to reset the capacitor.

A controller 340 provides the control signals to the switches in ramp generator 300. Controller 340 may be implemented with logic or a microcontroller.

Figure 4:
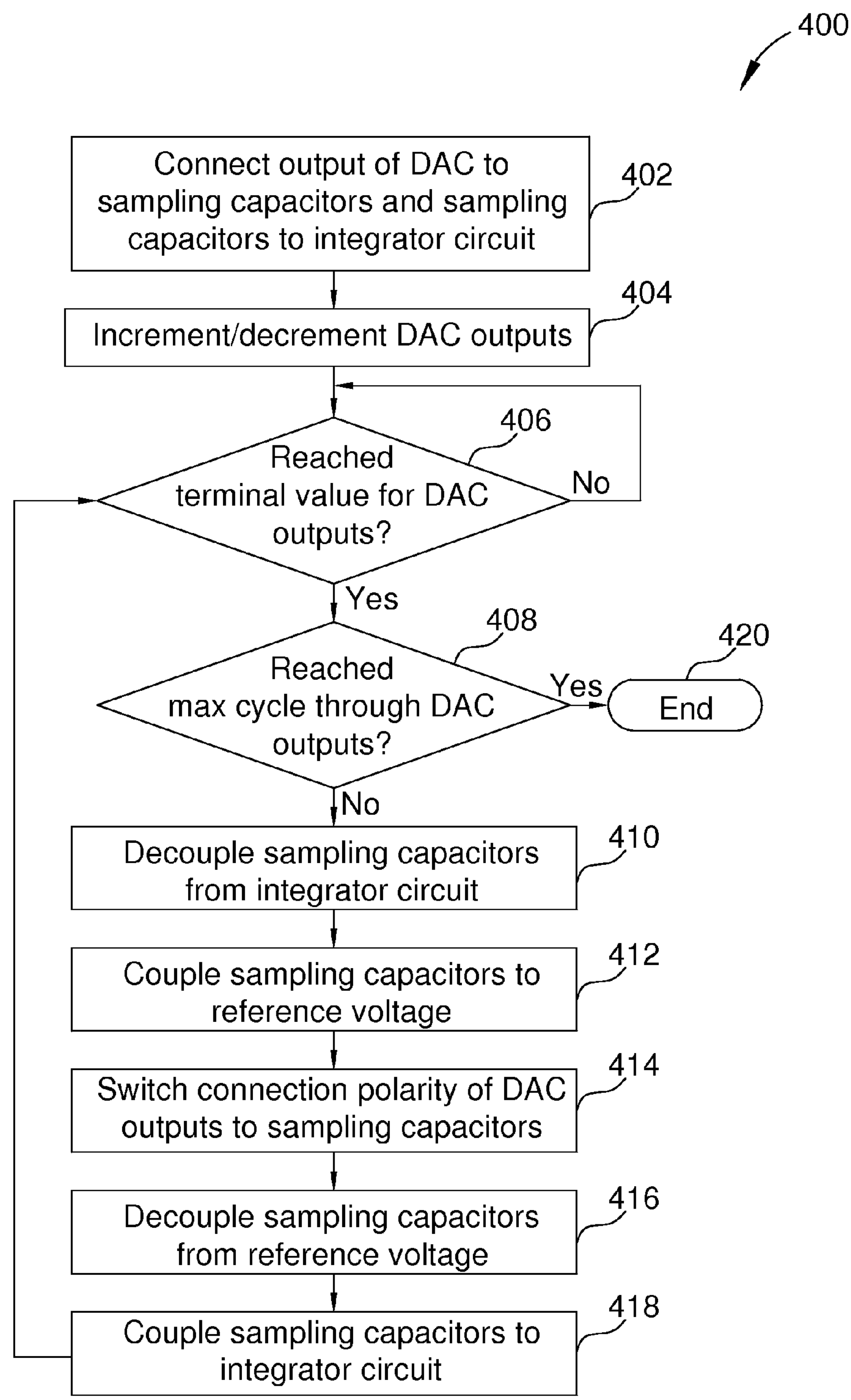
FIG. 4 is a method for operating the ramp generator of FIG. 3.

FIG. 4 is a flowchart of a method 400 for operating ramp generator 300 in one embodiment of the present disclosure. Method 400 may be implemented with controller 340 providing the appropriate control signals to the switches in ramp generator 300. Method 400 begins in block 402.

In block 402, the outputs of DAC 302 are coupled to sampling capacitors 306, 308 and sampling capacitors 306, 308 are coupled to integrator circuit 318. On the first half of ramp generator 300 for generating the negative ramp signal, controller 340 turns on switches 310, 322 and turns off switches 320, 312. In particular, controller 340 turns switch 320 off before turning switch 322 on. On the second half of ramp generator 300 for generating the positive ramp signal, controller 340 turns on switches 314, 328 and turns off switches 326, 316. In particular controller 340 turns switch 326 off before turning switch 328 on. Block 402 is followed by block 404.

In block 404, controller 340 causes DAC 302 to increment its positive output signal 256 times from its lowest value to its highest value, and to decrement its negative output signal 256 times from its highest value to its lowest value. Note that for non-linear ramp operation, controller 340 may cause DAC 302 to change its step size at various times. In this block, integrator circuit 318 starts to integrate the incrementing and decrementing values on sampling capacitors 306 and 308, respectively. Block 404 is followed by block 406.

In block 406, controller 340 determines if DAC 302 has cycled once through its positive and negative output signals. If so, block 406 is followed by block 408. Otherwise block 406 loops back to itself.

In block 408, controller 340 determines if DAC 302 has cycled four times through its positive and negative output signals. If so, then ramp generator 300 has completed generating the negative and the positive ramp signals and block 408 is followed by block 420, which ends method 400. Otherwise block 408 is followed by block 410.

Figure 5:
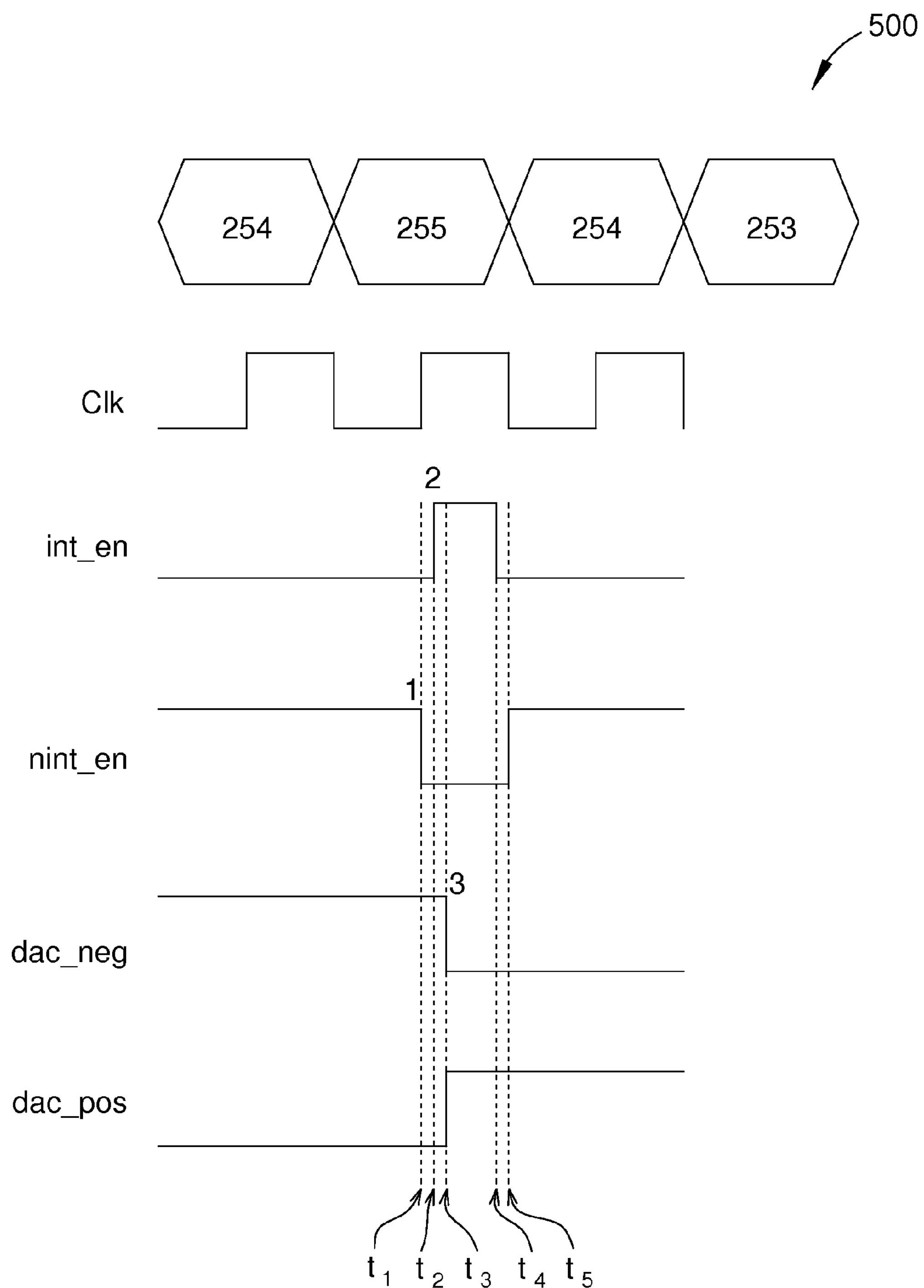
FIG. 5 is a timing diagram of the. ramp generator of FIG. 3, all arranged in accordance with at least some embodiments of the present disclosure.

In block 410, controller 340 decouples sampling capacitors 306 and 308 from integrator circuit 318 by turning off switches 322 and 328, respectively. As shown in the timing diagram of FIG. 5 in one embodiment of present disclosure, controller 340 drives low the control signal nint_en for switches 322 and 328 at time t1. In this block, integrator circuit 318 holds the current values of the negative and the positive ramp signals. Block 410 is followed by block 412.

In block 412, controller 340 couples the second sides of sampling capacitors 306 and 308 to a reference voltage (e.g., Vcm) by turning on switches 320 and 326, respectively. As shown in the timing diagram of FIG. 5, controller 340 drives high the control signal int_en for switches 320 and 326 at time t2. In this block, sampling capacitors 306 and 308 are reset to the reference voltage, thereby introducing kTC reset noise. Block 412 is followed by block 414.

In block 414, controller 340 reverses the connection polarity of the outputs from DAC 302 to sampling capacitors 306 and 308 by turning off switches 310, 314 and turning on switches 312, 316. As shown in the timing diagram of FIG. 5, controller 340 drives high the control signal dac_pos for switches 310, 316 and drives low the control signal dac_neg for switches 312, 314 at time t3. Block 414 is followed by block 416.

In block 416, controller 340 decouples the second sides of sampling capacitors 306 and 308 from the reference voltage (e.g., Vcm) by turning off switches 320 and 326, respectively. As shown in the timing diagram of FIG. 5, controller 340 drives low the control signal int_en for switches 320 and 326 at time t4. Block 416 is followed by block 418.

In block 418, controller 340 again couples sampling capacitors 306 and 308 to integrator circuit 318 by turning on switches 322 and 328, respectively. As shown in the timing diagram of FIG. 5, controller 340 drives high the control signal nint_en for switches 322 and 328 at time t5. After time 5, DAC 302 starts to decrement the one DAC output signal that has reached its highest level and increment the DAC output signal that has reached its lowest level. As the connection polarity between DAC 302 and sampling capacitors 306, 308 has switched, buffer circuit 318 continues to decrement the negative ramp signal and continues to increment the positive ramp signal with the output signals from DAC 302. Block 418 is followed by block 406.

Ramp generator 300 operating under method 400 minimizes the kTC reset noise as sampling capacitors 306 and 308 are only reset four times when the connection polarity between DAC 302 and sampling capacitors 306 and 308 are reversed. Thus a larger capacitance ratio between sampling capacitors 306, 308 and feedback capacitors 330, 334 may be used. For example, a capacitance ratio of 1/8 with capacitors 306 and 308 may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A ramp generator, comprising:

a digital-to-analog converter (DAC);

a sampling capacitor;

an integrator circuit;

a polarity reversing switch selectively coupling first and second outputs of the DAC to a first side of the sampling capacitor;

a first switch coupling a second side of the sampling capacitor to a reference voltage source; and a second switch coupling the second side of the sampling capacitor to an input of the integrator circuit.

2. The ramp generator of claim 1, wherein the integrator circuit comprises:

a buffer; and a feedback capacitor coupled between a positive output and a negative input of the buffer, the negative input of the buffer being the input of the integrator circuit.

3. The ramp generator of claim 2, wherein the polarity reversing switch comprises:

a third switch coupling the first output of the DAC to the first side of the sampling capacitor; and a fourth switch coupling the second output of the DAC to the first side of the sampling capacitor.

4. The ramp generator of claim 3, further comprising:

another sampling capacitor, wherein the polarity reversing switch selectively couples the first and the second outputs of the DAC to a first side of the other sampling capacitor;

a fifth switch coupling a second side of the other sampling capacitor to the reference voltage source; and a sixth switch coupling the second side of the other sampling capacitor to another input of the integrator circuit.

5. The ramp generator of claim 4, wherein the integrator circuit further comprises:

another feedback capacitor coupled between a negative output and a positive input of the buffer, the positive input of the buffer being the other input of the integrator circuit.

6. The ramp generator of claim 5, wherein the polarity reversing switch further comprises:

a seventh switch coupling the first output of the DAC to the first side of the other sampling capacitor; and an eight switch coupling the second output of the DAC to the first side of the other sampling capacitor.

7. The ramp generator of claim 6, wherein the DAC has a first resolution and the ramp generator has a greater resolution.

8. An analog-to-digital converter (ADC), comprising:

a ramp generator, comprising:

a digital-to-analog converter (DAC);

a first sampling capacitor;

a second sampling capacitor;

an integrator circuit;

a polarity reversing switch selectively coupling first and second outputs of the DAC to first sides of the first and the second sampling capacitors;

a first switch coupling a second side of the first sampling capacitor to a reference voltage source;

a second switch coupling the second side of the first sampling capacitor to a negative input of the integrator circuit;

a third switch coupling a second side of the second sampling capacitor to the reference voltage source; and a fourth switch coupling the second side of the second sampling capacitor to a positive input of the integrator circuit.

9. The ADC of claim 8, wherein the integrator circuit comprises:

a buffer;

a first feedback capacitor and a first reset switch coupled between a positive output and a negative input of the buffer, the negative input of the buffer being the negative input of the integrator circuit; and a second feedback capacitor and a second reset switch coupled between a negative output and a positive input of the buffer, the positive input of the buffer being the positive input of the integrator circuit.

10. The ADC of claim 8, wherein the polarity reversing switch comprises:

a fifth switch coupling the first output of the DAC to the first side of the first sampling capacitor;

a sixth switch coupling the first output of the DAC to the first side of the second sampling capacitor, the fifth and the sixth switches being of opposite polarity and controlled by a first control signal;

a seventh switch coupling the second output of the DAC to the first side of the first sampling capacitor; and an eighth switch coupling the second output of the DAC to the first side of the second sampling capacitor, the seventh and the eighth switches being of opposite polarity and controlled by a second control signal.

11. The ADC of claim 8, wherein the DAC has a first resolution and the ramp generator has a greater resolution.

12. The ADC of claim 8, further comprising:

a third sampling capacitor having a first side coupled to a negative output of the ramp generator;

a fourth sampling capacitor having a first side coupled to a positive output of the ramp generator;

a comparator having inputs coupled to second sides of the third and the fourth sampling capacitors;

a counter;

a latch coupled to an output of the counter and an output of the comparator; and a memory coupled to an output of the latch.

13. The ADC of claim 12, further comprising:

a fifth switch coupling the first side of the third sampling capacitor to a bus to sense a pixel signal; and a sixth switch coupling the first side of the fourth sampling capacitor to the bus to sense a reset signal.

14. A method, comprising:

selectively coupling one of first and second outputs from a digital-to-analog converter (DAC) to a sampling capacitor;

incrementing the first output and decrementing the second output of the DAC;

sampling the one of the first and the second outputs with the sampling capacitor;

integrating a value on the sampling capacitor with an integrator circuit;

when the first and the second outputs reach terminal values:

decoupling the sampling capacitor from the integrator circuit;

coupling the sampling capacitor to a reference voltage source to reset the sampling capacitor;

selectively coupling the other one of the first and the second outputs to the sampling capacitor;

decoupling the sampling capacitor from the reference voltage source; and coupling the sampling capacitor back to the integrator circuit;

decrementing the first output and incrementing the second output of the DAC;

sampling the other one of the first and the second outputs with the sampling capacitor; and integrating the value on the sampling capacitor with the integrator circuit.

15. The method of claim 14, further comprising:

selectively coupling the other one of the first and the second outputs to another sampling capacitor;

sampling the other one of the first and the second outputs with the other sampling capacitor;

integrating a value on the other sampling capacitor with the integrator circuit;

when the first and the second outputs reach the terminal values:

decoupling the other sampling capacitor from the integrator circuit;

coupling the other sampling capacitor to the reference voltage source to reset the other sampling capacitor;

selectively coupling the one of the first and the second outputs to the other sampling capacitor;

decoupling the other sampling capacitor from the reference voltage source; and coupling the other sampling capacitor back to the integrator circuit;

sampling the one of the first and the second outputs with the other sampling capacitor; and integrating the value on the other sampling capacitor with the integrator circuit.

* * * * *